US006373290B1

(12) United States Patent
Forbes

(10) Patent No.: US 6,373,290 B1
(45) Date of Patent: Apr. 16, 2002

(54) CLOCK-DELAYED PSEUDO-NMOS DOMINO LOGIC

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/651,630

(22) Filed: Aug. 30, 2000

(51) Int. Cl.$^7$ ............................................... H03K 19/096
(52) U.S. Cl. ............................. 326/98; 326/96; 326/97
(58) Field of Search .............................. 326/93, 95, 96, 326/98, 97

(56) References Cited

U.S. PATENT DOCUMENTS

| | | | |
|---|---|---|---|
| 5,402,012 A | 3/1995 | Thomas | 326/97 |
| 5,532,625 A | 7/1996 | Rajivan | 326/98 |
| 5,999,019 A | * 12/1999 | Zheng et al. | 326/98 |
| 6,069,496 A | * 5/2000 | Perez | 326/98 |

OTHER PUBLICATIONS

Yee and Sechen, "Clock–Delayd Domino for Adder and Combinational Logic Design," presented at ICCD96, Oct. 7–9, 1996.

* cited by examiner

Primary Examiner—Michael Tokar
Assistant Examiner—Anh Tran
(74) Attorney, Agent, or Firm—Williams, Morgan & Amerson, P.C.

(57) ABSTRACT

A logic gate includes a logic circuit having an input node and an output node, an enabling transistor coupled between a first power supply node and the output node, the enabling transistor adapted to couple the output node to the first power supply node during an evaluation phase in the logic gate, and a pre-charge transistor coupled between the output node and a second power supply node, the pre-charge transistor adapted to couple the output node to the second power supply node during a pre-charge phase in the logic gate.

24 Claims, 4 Drawing Sheets

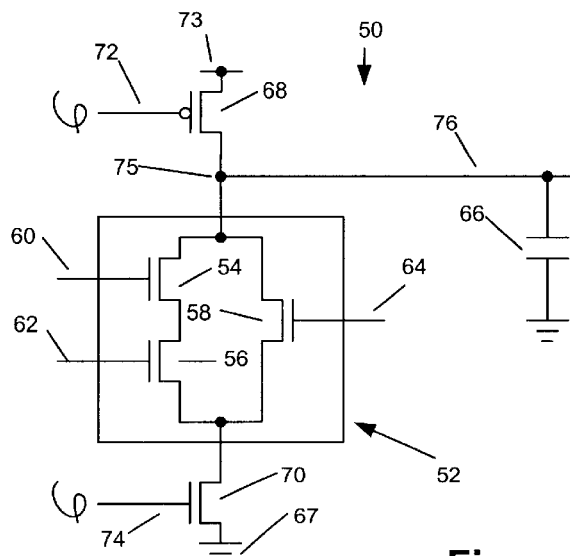
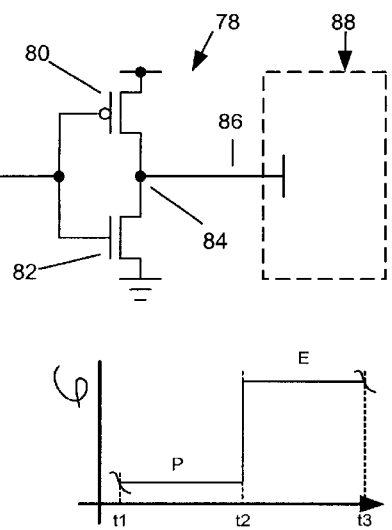
**Figure 3A
PRIOR ART**
**Figure 3B
PRIOR ART**
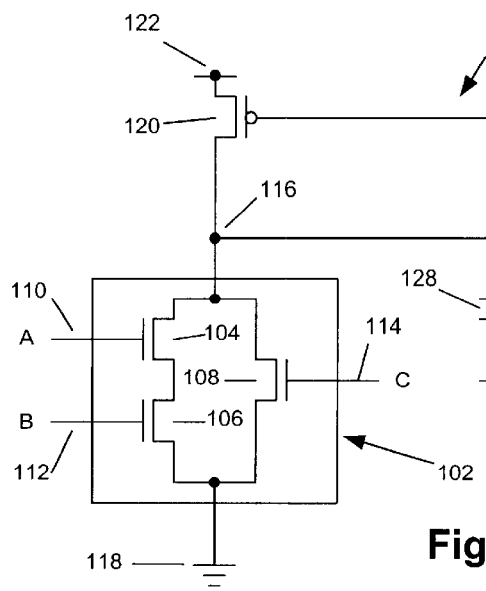
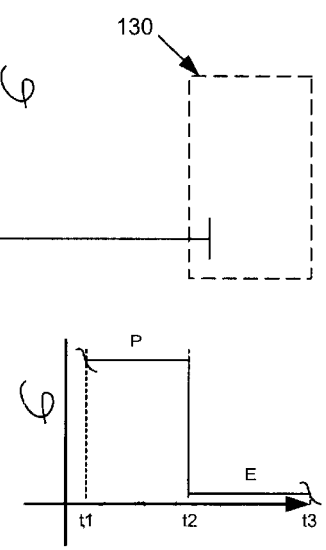
Figure 4A
Figure 4B

CLOCK-DELAYED PSEUDO-NMOS DOMINO LOGIC

BACKGROUND OF THE INVENTION

1. Field of the Invention

The present invention relates generally to semiconductor logic devices, and, more particularly, to clocked static logic useful for high frequency operations.

2. Description of the Related Art

Integrated circuitry to implement various logic functions is well known in the semiconductor industry. The use of transistors, capacitors and other integrated circuit elements to implement AND, OR, NAND, NOR, NOT, and other logical operations is well known in that art, and logic circuitry itself has taken on many forms. For example, logic circuitry has been implemented in NMOS technologies as well as in CMOS technologies, each with its own advantages and disadvantages. Moreover, logic circuitry may be implemented in dynamic or static, clocked or not clocked, circuitry. CMOS logic is preferred in many applications because of its relatively low power dissipation, as compared to, for example, NMOS logic.

FIG. 1 shows a standard two-input CMOS static logic NOR gate 10, while FIG. 2 shows a two-input pseudo-NMOS static logic NOR gate 30. The CMOS static logic gate 10 of FIG. 1 includes two PMOS transistors 12, 14 and two NMOS transistors 16, 18. A capacitive load 20 exists on an output line 26. A signal on input line 22 is applied to the gate of the PMOS transistor 14 and to the gate of the NMOS transistor 18, while a signal at input line 24 is applied to the gate of the PMOS transistor 12 and to the gate of the NMOS transistor 16. The pseudo-NMOS gate 30 of FIG. 2 includes one PMOS transistor 32 and two NMOS transistors 36, 38. The gate of the PMOS transistor 32 is coupled to a ground potential 34, while signals at input lines 42, 44 are applied to the gates of the NMOS transistors 36 and 38, respectively. Again, a capacitive load 40 exists on the output line 46. The pseudo-NMOS gate 30, as compared to the CMOS static gate 10 of FIG. 1, has fewer devices and much less wiring complexity, and it yields comparable performance and consumes comparable power at high clock frequencies. However, the pseudo-NMOS gate 30 of FIG. 2 does dissipate DC power. Both the CMOS static logic gate 10 of FIG. 1 and the pseudo-NMOS gate 30 of FIG. 2 are well known to persons of ordinary skill in the art.

Pseudo-NMOS logic is a fully static logic family, and, like regular CMOS static logic systems with many logic levels, there may be many unnecessary switching transients before the data becomes stable and valid at the output. Clocked and/or dynamic logic systems can be employed to avoid these internal and unnecessary switching transients. In these systems, the signals are clocked through the system, and no evaluation is done at any logic gate until all the input signals arrive at the input terminals in the same time period. Only then is the logical decision made and the output signal determined and clocked forward to the next logic level.

One type of logic, commonly known as domino logic, offers certain advantages over static CMOS technology while retaining desirable low power dissipation characteristics. Domino logic gates may use either p-channel transistors or n-channel transistors for evaluating and realizing the Boolean function. Compared to CMOS circuits, domino logic reduces the number of devices required to implement a particular function, leading to reduced capacitive loading and circuit size. Domino logic has achieved widespread use in integrated circuits. With domino logic, a standard cell formed with a plurality of transistors represents a stage. A plurality of the stages can be cascaded or connected in series to implement the domino logic. A signal delivered to the first stage is evaluated, and the first stage produces an output signal that propagates to the second stage where the output signals of the first stage are evaluated. The second stage then produces additional output signals that, in turn, are propagated to the third stage wherein they are evaluated, and so on.

One feature of at least some forms of domino logic is that signals can propagate through the various stages without being separately clocked at each stage. Thus, a single clock cycle can be used to initiate the propagation of input signals through a plurality of cascaded stages, which collectively represent a relatively complex function. This avoids the need for high speed clocks to implement relatively complex functions, by avoiding the need for plural clock cycles to process the input signals. At the same time, the evaluation of the input signals within a single clock cycle provides relatively fast signal processing.

But despite these advantages, domino logic does have certain drawbacks. For example, where domino logic is implemented using MOS technology, certain functions are difficult to implement because they require the use of inverting logic functions (e.g., NOR, NOT, NAND functions). Instead, conventional MOS-implemented domino logic is generally limited to non-inverting gates to implement a function (e.g., AND, OR and so forth).

FIG. 3A shows a well-known CMOS domino logic circuit 50 which, in part, works on dynamic logic principles. The circuit 50 includes a PMOS transistor 68 that serves to pre-charge the capacitive load 66, and an NMOS transistor 70 that serves to enable the circuit 50. An exemplary logic function 52 is shown in FIG. 3 and comprises three NMOS transistors 54, 56, 58 that receive input signals on lines 60, 62, 64, respectively. Of course, any of a variety of different logic functions may be implemented in the logic function 52. The PMOS transistor 68 is coupled between a power supply potential 73 and a node 75 of the logic function 52, and the NMOS transistor 70 is coupled between the logic function 52 and a ground potential 67. Each of the PMOS transistor 68 and the NMOS transistor 70 receive a signal "phi" at its gate terminal. FIG. 3B illustrates the two phases of the signal "phi": a low potential during the pre-charge phase (between times t1 and t2), and a high potential during the evaluation phase (between times t2 and t3).

During the pre-charge phase, the low signal "phi" will cause the transistor 68 to conduct, thereby charging the load capacitance 66 to approximately the value of the supply voltage 73. The non-conducting transistor 70 will prevent discharge of the load capacitance 66 during the pre-charge phase. At the end of the pre-charge phase and the beginning of the evaluation phase, the transistor 68 will stop conducting, and the transistor 70 will be turned on. If the logic function 52 results in a conductive path (signals on lines 60, 62 are both high, or signal on line 64 is high), the load capacitance 66 will be discharged during the evaluation period. CMOS domino logic requires an inverter on the output of each gate to avoid a potential race condition where the output signal races forward from one gate to the next, resulting in logic errors. The inverter 78 serves to insure that after pre-charge, the output of each gate 50 is low and none of the NMOS transistors performing logic functions in the next gate 88 will be turned on. While this logic family has no DC power dissipation, it incorporates extra transistors and signal delays in the inverter 78.

A number of different systems exist aside from standard two-phase dynamic CMOS logic. For example, sequentially clocked domino logic is illustrated in U.S. Pat. No. 5,402, 012, issued Mar. 28, 1995, entitled "Sequentially Clocked Domino Logic Cells." Wave propagation logic is illustrated in U.S. Pat. No. 5,532,625, issued Jul. 2, 1996, entitled "Wave Propagation Logic." Clock-delayed domino logic is discussed in Yee and Sechen, "Clock-Delayed Domino for Adder and Combinational Logic Design," ICCD 96, Oct. 7–9, 1996. Standard two-phase dynamic logic requires the generation of two clock signals, which are used to drive large capacitive loads. This is avoided in the latter three logic families by using clock signals that are passed from one logic level or stage to another by a string of inverters or clock delay logic. Sequentially clocked domino logic, wave propagation logic and clock-delayed domino logic all use a single clock which has a very low capacitive load. This single clock drives a string of inverters, which generate other clock signals.

The present invention is directed to solving, or at least reducing the effects of, some or all of the aforementioned problems.

SUMMARY OF THE INVENTION

In one aspect of the present invention, a logic gate comprises a logic circuit having an input node and an output node, an enabling transistor coupled between a first power supply node and the output node, the enabling transistor adapted to couple the output node to the first power supply node during an evaluation phase in the logic gate, and a pre-charge transistor coupled between the output node and a second power supply node, the pre-charge transistor adapted to couple the output node to the second power supply node during a pre-charge phase in the logic gate.

In another aspect of the present invention, a domino logic system comprises a first stage and a second stage. The first stage comprises a first logic circuit having an input node and an output node, a first enabling transistor coupled between the output node of the first logic circuit and a first power supply node and adapted to couple the output node for the first logic circuit to the first power supply node during an evaluation phase in the first stage, and a first pre-charge transistor coupled between the output node of the first logic circuit and a second power supply node and adapted to couple the output node of the first logic circuit to the second power supply node during a pre-charge phase in the first stage. The second stage comprises a second logic circuit having an input node and an output node, a second enabling transistor coupled between the output node of the second logic circuit and the first power supply node and adapted to couple the output node of the second logic circuit to the first power supply node during an evaluation phase in the second stage, and a second pre-charge transistor coupled between the output node of the second logic circuit and the second power supply node and adapted to couple the output node of the second logic circuit to the second power supply node during a pre-charge phase in the second stage. The output node of the first logic circuit is coupled to the input node of the second logic circuit.

In yet another aspect of the present invention, a clock-delayed pseudo-NMOS domino logic system comprises a first stage and a second stage. The first stage comprises a first logic circuit having a first input node and a first output node, a first enabling transistor coupled between the first output node and a first power supply node, and a first pre-charge transistor coupled between the first output node and a second power supply node. The second stage comprises a second logic circuit having a second input node and a second output node, a second enabling transistor coupled between the second output node and the first power supply node, and a second pre-charge transistor coupled between the second output node and the second power supply node. The clock-delayed pseudo-NMOS domino logic system further comprises a clock signal line coupled to the first and second pre-charge transistors and to the first and second enabling transistors. The first output node is coupled to the second output node.

BRIEF DESCRIPTION OF THE DRAWINGS

The invention may be understood by reference to the following description, taken in conjunction with the accompanying drawings, in which like reference numerals identify like elements, and in which:

FIG. 3A is a schematic diagram of a CMOS domino logic circuit;

FIG. 3B illustrates a clock signal "phi" used in conjunction with the particular circuit of FIG. 3A;

FIG. 4A is a schematic diagram of one illustrative clock-delayed pseudo-NMOS domino logic circuit embodying aspects of the present invention;

FIG. 4B illustrates a clock signal "phi" used in conjunction with the particular circuit of FIG. 4A;

Figure 1:
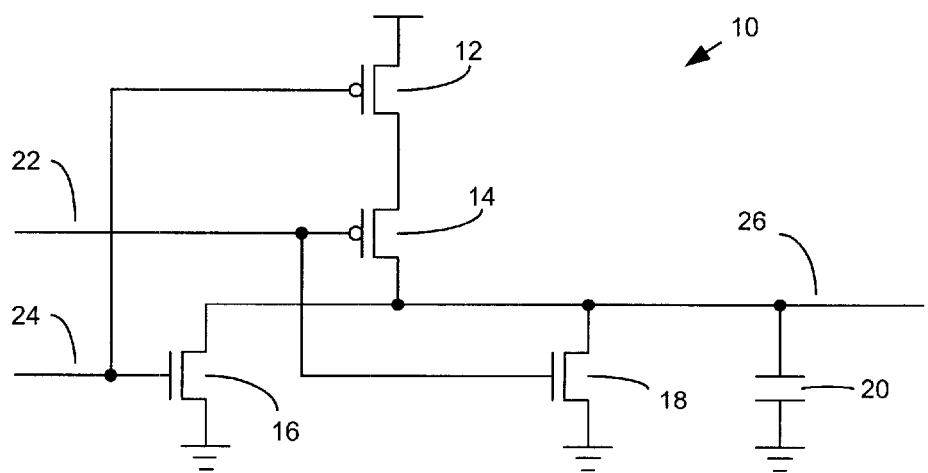
FIG. 1 is a schematic diagram of a two-input CMOS static logic NOR gate.
Figure 2:
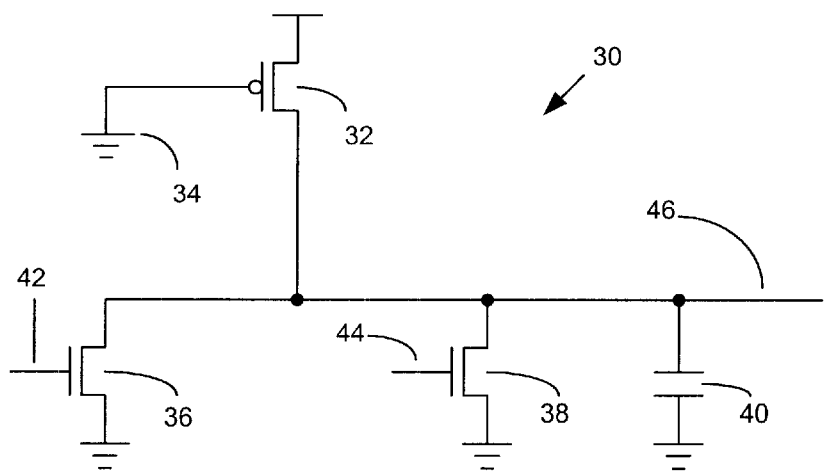
FIG. 2 is a schematic diagram of a two-input pseudo-NMOS static logic NOR gate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, including, for example, compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 4–6. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

FIG. 4A is a schematic diagram of one illustrative embodiment of a pseudo-NMOS logic gate 100 incorporating aspects of the present invention. In this context, the term "pseudo-NMOS" refers generally to the use of a PMOS transistor as a load device in an NMOS circuit without any signals input to the gate of the PMOS Transistor. As will be appreciated by the person of ordinary skill in the art having the benefit of this disclosure, the exemplary gate 100 illustrated in FIG. 4A may be incorporated into a clock-delayed domino logic circuit to form one specific embodiment of the present invention. In such an embodiment, the output signal of one gate will be provided as an input signal to a following gate, as will be understood by the person of ordinary skill in the art having the benefit of this disclosure.

The gate 100 includes a logic circuit 102 that may implement one of a variety of Boolean logic functions. For example, the Boolean function implemented by the particular circuit illustrated in the circuit 102 is ((A.AND.B).OR.C). Many other desirable Boolean functions could be implemented within the logic circuit 102 and be useful within the gate 100 of FIG. 4A. The circuit 102 of the gate 100 is coupled between a node 116 and a ground potential 118. The node 116 comprises an output node of the gate 100 and will be coupled to a follow-on gate 130 in implementing a clock-delayed domino logic circuit. A capacitive load 128 is coupled between the output node 116 and the ground potential 118.

The gate 100 further comprises a PMOS transistor 120 coupled between a power supply potential 122 and the node 116, as well as an NMOS transistor 126 coupled between the node 116 and the ground potential 118. The gates of the PMOS transistor 120 and the NMOS transistor 126 are driven by a two-phase clock signal "phi" on a line 124. The two phases of the clock signal "phi" are illustrated in FIG. 4B. During its pre-charge phase, between times t1 and t2, the clock signal "phi" is in a high state. In this state, the clock signal "phi" will cause the PMOS transistor 120 to be non-conducting and the NMOS transistor 126 to be in a conducting state, thereby pulling the node 116 to or near the ground potential 118 by discharging the capacitive load 128. Thus, the NMOS transistor 126 serves to pre-charge the node 116 of the gate 100 to a low level. Because the node 116 and the capacitive load 128 are essentially discharged during the pre-charge phase, the output signal of the gate 100, as well as the output signals of other like gates in a domino logic circuit utilizing the gate 100, will be low, and no inverter is used as in the case of the circuit of FIG. 3. During the evaluation phase, between times t2 and t3, the clock signal "phi" will be in a low state. In this low state, the clock signal "phi" will cause the NMOS transistor 126 to be in a non-conducting state and cause the PMOS transistor 120 to be in a conducting state. Under this condition, the PMOS transistor 120 will attempt to pull the voltage at the node 116 up toward the power supply potential 122. The PMOS transistor 120 serves to enable the gate 100 and respond to the logic function implemented in the circuit 102. If the logic circuit 102 does not provide a conductive path to the ground potential 118, the capacitive load 128 will be charged toward the power supply potential 122, and the output signal at the node 116 will go to a high level, or positive logic "one" state. If the circuit 102 does provide a conductive path to the ground potential 118, then the voltage at the node 116 and on the capacitive load 128 will remain low, and the output signal at the node 116 will maintain a low logic "zero" state.

When two or more logic gates 100 are cascaded together in succession, all the input signals to the gate 100 must arrive at the logic gate input in the same time frame. This insures that the logic signals proceed from one gate to the next, and there is the appearance of the gates making evaluations in succession, or falling over like dominoes. In this respect, a domino logic circuit employing the gates 100 will give an appearance similar to CMOS domino logic utilizing gates such as those illustrated in FIG. 3. However, CMOS domino logic works on dynamic charge storage principles, whereas the pseudo-NMOS domino logic circuits described herein work on purely static logic principles. For example, the output of any of the gates 100 may be probed and tested on a DC basis using a voltmeter with finite input impedance without causing logic errors.

Figure 5A:
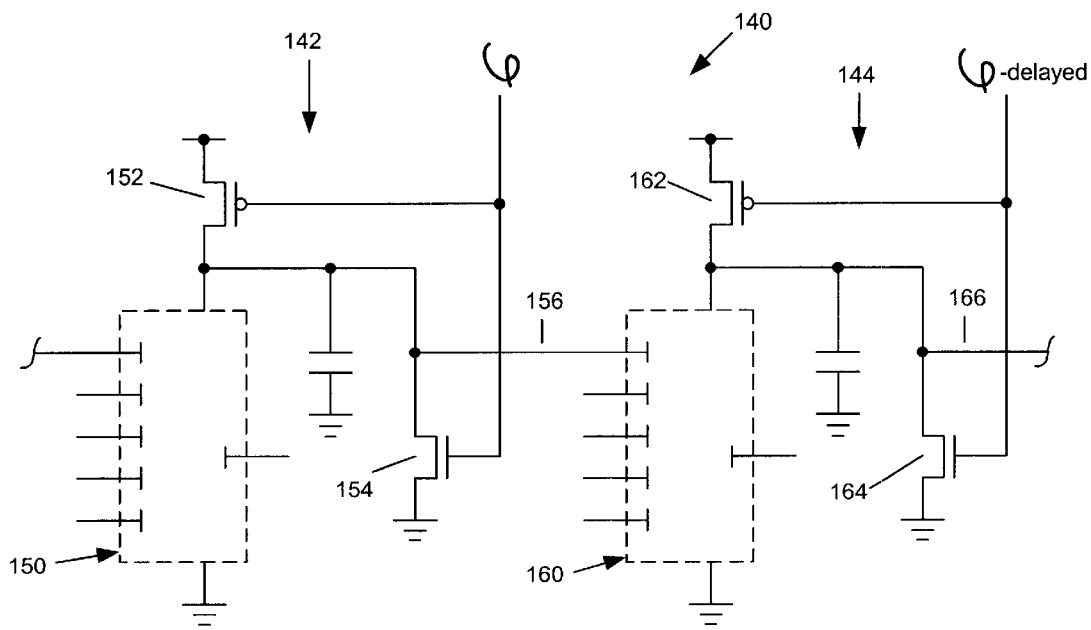
FIG. 5A illustrates a clock-delayed pseudo-NMOS logic system implementing aspects of the present invention.

FIG. 5A illustrates a clock-delayed pseudo-NMOS domino logic system 140 implementing aspects of the present invention. As the person of ordinary skill will recognize with the benefit of this disclosure, the system 140 of FIG. 5A helps reduce or avoid power dissipation problems associated with unnecessary DC conductive paths and switching transients. The domino logic system 140 includes multiple stages, only one pair of stages 142, 144 being shown. Each stage 142, 144 comprises a logic gate very much like the gate 100 of FIG. 4. The stage 142 includes logic 150, a PMOS transistor 152 and an NMOS transistor 154. The logic 150 may receive multiple input signals from preceding stages (not shown) of the domino logic system 140. A clock signal "phi" provides a gate drive to a transistor 154 to pre-charge the output 156 of the stage 142 and provides a gate drive to transistor 152 to enable the stage 142. When the stage 142 is enabled, the logic 150 will determine whether the output terminal 156 remains at a low level or is charged to a high level through the transistor 152.

The stage 144 includes logic 160 that also may receive multiple input signals from preceding stages, including from the stage 142. The stage 144 includes an NMOS transistor 164 that serves to pre-charge an output terminal 166 to a low level and a PMOS transistor 162 that serves to enable the stage 144. The logic 160 will, as before, determine whether the output terminal 166 remains low or transitions to a high level when the stage 144 is enabled. A delayed version ("phi-delayed") of the clock signal "phi" controls the pre-charge and enable phases of the stage 144. The output terminal 166 of the stage 144 may be coupled to an input terminal to a following stage (not shown) or it may be used to deliver the output signal of the system 140.

Figure 5B:
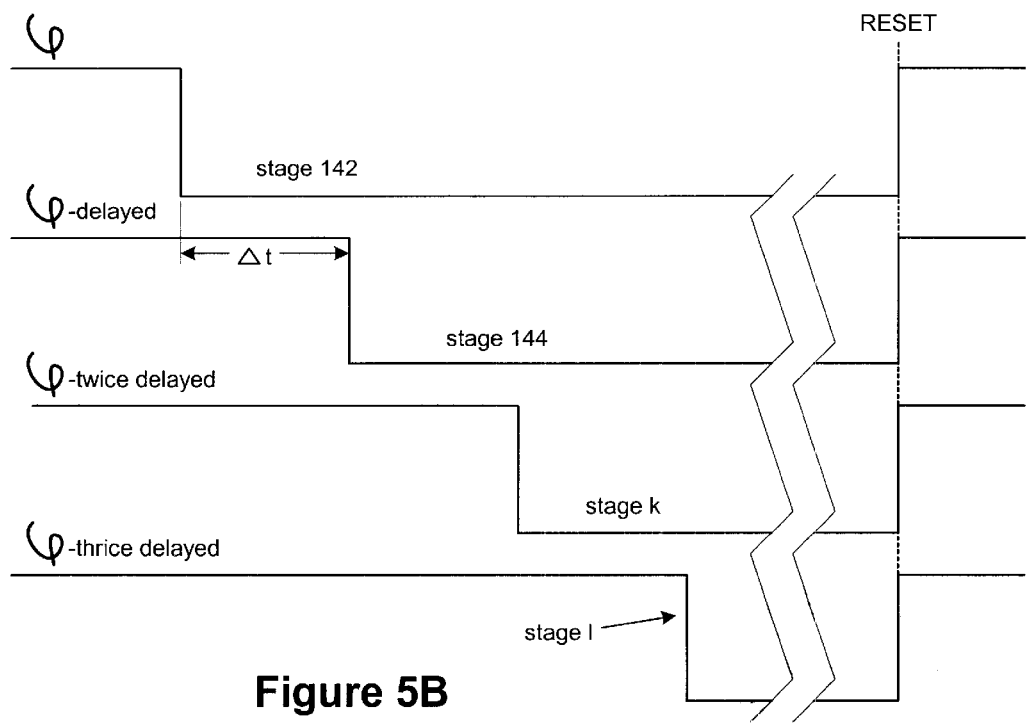
FIG. 5B illustrates relative timing of certain clock signals used in conjunction with the system of FIG. 5A.

FIG. 5B illustrates the relative timing of clock signals useful in implementing the system 140 of FIG. 5A. The signal "phi" controls the pre-charge and enable phases of the stage 142. The signal "phi-delayed" controls the pre-charge and enable phases of the stage 144. The signal "phi-delayed" transitions from high to low after the signal "phi" transitions from high to low. Thus, the stage 144 remains in the pre-charge phase for a period of time ($\Delta t$) after the stage 142 has been enabled. This period of time ($\Delta t$) is sufficient for the logic 150 of the stage 142 to evaluate its input signals and to transition the output terminal 156 from its low pre-charge level to a valid high level, if a transition is dictated by the logic 150. A signal "phi-twice delayed" will control the pre-charge and enable phases of a stage "k" (not shown) following the stage 144, and the signal "phi-thrice delayed" will control the pre-charge and enable phases of a stage "l" (not shown) following the stage "k." As illustrated in FIG. 5B, the signal "phi-twice delayed" transitions from high to low after the signal "phi-delayed" so transitions, meaning the stage "k" will be enabled after the stage 144 has been enabled and had sufficient time to produce a valid logic signal at the output terminal 166. Likewise, the signal "phi-thrice delayed" transitions from high to low after the signal "phi-twice delayed" so transitions, meaning the stage "l" will be enabled after the stage "k" has been enabled and had sufficient time to produce a valid output signal. After all stages in the system 140 have been enabled and the output signal of the system 140 is valid, the system 140 may be reset by resetting all the signals "phi," "phi-delayed," "phi-twice delayed", "phi-thrice delayed," etc., to their high levels. At that time, all stages will be set to their pre-charge state, meaning any stage whose output terminal was charged to a high level during the immediately preceding evaluation period will have its output terminal discharged.

In the particular domino logic system illustrated in FIG. 5A, logic signals are clocked through pairs of logic levels by using a clock pulse that is delayed from one stage to the next. In a system with a number of logic levels, most logic gates will be inactive with their output states pre-charged to a low level. No DC conductive paths will exist in these gates between the power supply and ground. The gates that are active work on fully static logic principles, i.e., there is no temporary storage of data on capacitive nodes. A positive-going clock pulse is applied to pre-charge a logic stage or level, and a negative-going clock pulse is applied to activate the logic stage or level. If some or all of the input signals from the previous stage are high and the pull-down logic circuit provides a DC path to ground, then during the evaluation phase, as the clock goes low, the output signal will remain low. If there is no DC path to ground provided by the pull-down logic function, the output signal will rise to a high value. Thus, this is an inverting gate.

The clock pulse must remain low until the logic signals have progressed to the output terminal of the pseudo-NMOS domino logic system. The output state thus cannot change the final result at the output terminal of the domino logic system until the clock signals all return to the reset condition, i.e., the high state. The output signal of each stage is stable and data is valid on a DC basis until the clock signals go to their reset condition, thus providing a fully static logic system until the clocks reset.

Figure 6:
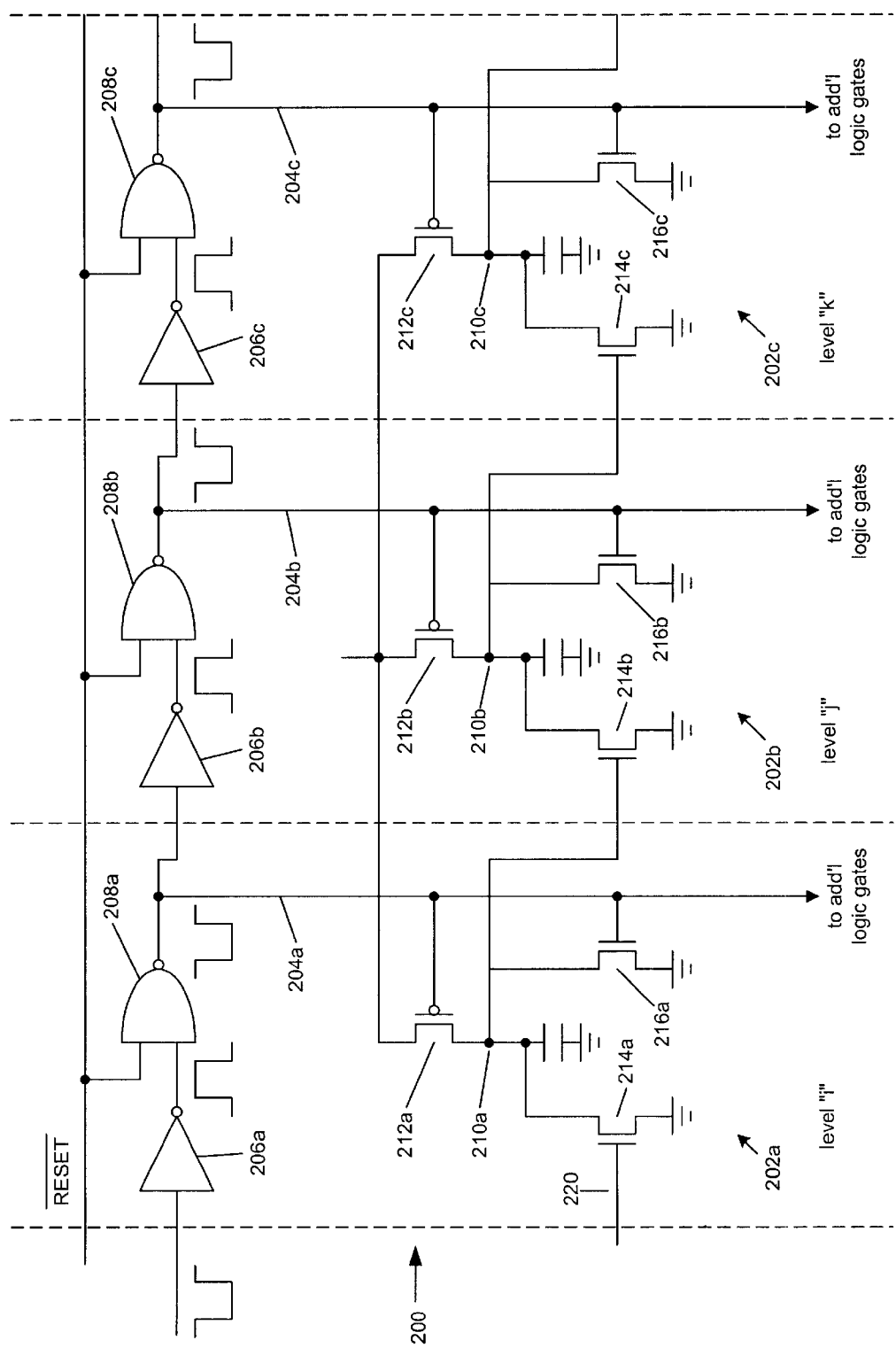
FIG. 6 is a schematic diagram of one particular embodiment of a clock-delayed pseudo-NMOS domino logic system utilizing aspects of the present invention.

FIG. 6 is a schematic diagram of one particular embodiment of a clock-delayed pseudo-NMOS domino logic system 200 utilizing aspects of the present invention. FIG. 6 illustrates a succession of NOR gates 202a, 202b, 202c or inverters that are used by way of illustration. The delayed clock signals 204a, 204b, 204c are generated by a string of inverters 206a, 206b, 206c and NAND gates 208a, 208b, 208c. Each delayed clock signal, 204a, 204b, 204c can drive many gates in the same logic level, as, for example, not only the gate 202a in logic level "i," but also any and all other logic gates (not shown) in the same logic level.

In the system 200 of FIG. 6, the supply voltage is 2.5 VDC. The clock signals 204a, 204b, 204c are separated in time by approximately 5 nsec. For faster operation, this delay between the clock signals 204a, 204b, 204c may be shortened to as little as approximately 1 nsec, the only restraint being the amount of time necessary to ensure a valid output signal from the preceding stage. The capacitance on each of the output nodes 210a, 210b, 210c is approximately 0.1 pF. Each of the transistors 212a–212c, 214a–214c, 216a–216c in the gates 202a, 202b, 202c is approximately 1 $\mu$m in length. Each of the NMOS transistors 214a–214c, 216a–216c is approximately 3 $\mu$m in width, while each of the PMOS transistors 212a–212c is approximately 1 $\mu$m in width. The threshold voltage of each NMOS transistor is approximately 0.3 VDC, while the threshold voltage of each PMOS transistor is approximately −0.3 VDC. When the input node 220 to the gate 202a is at a low level, no steady state DC current is drawn from the power supply. The charging current needed to charge each of the output nodes 210a, 210c is approximately 75 $\mu$A for a period of about 2 nsec, after which the current level drops to about zero over a period of about an additional 3 nsec. Even at this low frequency of operation, about 40% of the current and power consumed is AC power or transient switching power associated with charging two load capacitors. The output signal at node 210a is valid within approximately 3 nsec after the gate 202a is enabled by the falling clock signal 204a. The output signal at the node 210c is valid within approximately 15 nsec after the gate 202a is enabled, in the example given here where the delay between the clocks is 5 nsec.

Pseudo-NMOS domino logic systems utilizing the present invention will generally have fewer transistors but comparable performance and power dissipation at high clock frequencies as compared to standard CMOS domino logic. Although, a DC conduction path can exist through the transistors in pseudo-NMOS systems at any given stage, during the evaluation phase, all the inputs to any particular stage are low and there is no potential DC path until the logic signals arrive at that particular gate. And on the average, less than one-half the gates will have a conductive DC path to ground. Further, the clock-delayed pseudo-NMOS domino logic system serves to minimize the number of load capacitances, which must be charged, and the number of switching transients. The pre-charge condition is to discharge all load capacitances, not charge all load capacitances, as in CMOS domino logic. The charging of all load capacitances serves to waste energy and increase power dissipation. In clock-delayed pseudo-NMOS domino logic, a load capacitance is charged if and only if the logic function does not provide a conductive path to ground, or roughly speaking, only about one-half the load capacitors will be charged. In standard CMOS domino logic, about one-half the capacitors, which were all previously pre-charged, will be discharged, wasting energy and increasing power consumption.

Moreover, as compared to the clock-delayed pseudo-NMOS domino logic, an extra signal delay exists in standard CMOS domino logic. The load capacitor in standard CMOS domino logic must first be discharged, and then the signal inverted by the inverter circuit on the output terminal. Not only does this inversion consume extra power, but there is an additional signal delay in that the output node of the inverter, another load capacitance, must be charged before the signal arrives at the input terminal to the next logic gate or before the data at the output terminal becomes valid. Consequently, CMOS domino logic has two signal delays in each logic gate, while clock-delayed pseudo-NMOS domino logic has only one signal delay. While clock-delayed pseudo-NMOS domino logic may have a DC path in each gate, which increases DC power dissipation, in high frequency applications and operations at high clock rates, clock-delayed pseudo-NMOS domino logic has less AC or transient power dissipation, smaller signal delays, and it utilizes fewer transistors in each gate. Thus, clock-delayed pseudo-NMOS domino logic offers advantages that were heretofore unavailable, particularly in high clock rate and high frequency applications as well as when static logic levels are required or desired.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A domino logic system, comprising:
   a first stage, having:
      a first logic circuit having an input node and an output node;
      a first enabling transistor coupled between the output node of the first logic circuit and a first power supply node and adapted to couple the output node of the first logic circuit to the first power supply node during an evaluation phase in the first stage; and
      a first pre-charge transistor coupled between the output node of the first logic circuit and a second power supply node and adapted to couple the output node of the first logic circuit to the second power supply node during a pre-charge phase in the first stage;
   a second stage, having:
      a second logic circuit having an input node and an output node;
      a second enabling transistor coupled between the output node of the second logic circuit and the first power supply node and adapted to couple the output node of the second logic circuit to the first power supply node during an evaluation phase in the second stage; and
      a second pre-charge transistor coupled between the output node of the second logic circuit and the second power supply node and adapted to couple the output node of the second logic circuit to the second power supply node during a pre-charge phase in the second stage;
   the output node of the first logic circuit coupled to the input node of the second logic circuit;
   a first clock signal line coupled to a gate terminal of the first pre-charge transistor and to a gate terminal of the first enabling transistor; and
   a second clock signal line coupled to a gate terminal of the second pre-charge transistor and to a gate terminal of the second enabling transistor,
   the first and second clock signal lines adapted to provide first and second two-phase clock signals, respectively.

2. The domino logic system of claim 1, wherein the first power supply node comprises a positive power supply node and the second power supply node comprises a power supply electrical ground node.

3. The domino logic system of claim 1, wherein the first logic circuit comprises at least one transistor to implement a first Boolean function, and wherein the second logic circuit comprises at least one transistor to implement a second Boolean function.

4. The domino logic system of claim 1, wherein the evaluation phase in the second stage is initiated not later than approximately 5 nanoseconds after the evaluation phase in the first stage is initiated.

5. The domino logic system of claim 1, wherein the first and second pre-charge transistors are n-channel transistors, and wherein the first and second enabling transistors are p-channel transistors.

6. The domino logic system of claim 5, wherein the first power supply node comprises a positive power supply node and the second power supply node comprises a power supply electrical ground node.

7. The domino logic system of claim 1, wherein the first and second pre-charge transistors are p-channel transistors, and wherein the first and second enabling transistors are n-channel transistors.

8. The domino logic system of claim 1, wherein the evaluation phase in the second stage is initiated not later than approximately 5 nanoseconds after the evaluation phase in the first stage is initiated.

9. The domino logic system of claim 1, wherein the first two-phase clock signal comprises a first phase having a high voltage level and a second phase having a low voltage level, and wherein the second two-phase clock signal comprises a first phase having a high voltage level and a second phase having a low voltage level.

10. The domino logic system of claim 9, wherein the first and second pre-charge transistors are n-channel transistors, and wherein the first and second enabling transistors are p-channel transistors.

11. The domino logic system of claim 10, wherein the first power supply node comprises a positive power supply node and the second power supply node comprises a power supply electrical ground node.

12. The domino logic system of claim 9, wherein the first and second pre-charge transistors are p-channel transistors, and wherein the first and second enabling transistors are n-channel transistors.

13. The domino logic system of claim 9, further comprising a delay circuit coupled between the first clock signal line and the second clock signal line and adapted to delay an onset of the second phase of the second two-phase clock signal relative to an onset of the second phase of the first two-phase clock signal.

14. The domino logic system of claim 1, further comprising a delay circuit coupled between the first clock signal line and the second clock signal line and adapted to delay the evaluation phase in the second stage relative to the evaluation phase in the first stage.

15. The domino logic system of claim 1, further comprising a clock signal line coupled to the first and second pre-charge transistors and coupled to the first and second enabling transistors.

16. The domino logic system of claim 15, wherein the clock signal line comprises a first clock signal line segment and a second clock signal line segment, the first clock signal line segment being coupled to the first pre-charge transistor and the first enabling transistor and the second clock signal line segment being coupled to the second pre-charge transistor and the second enabling transistor.

17. The domino logic system of claim 16, further comprising a delay circuit coupled between the first clock signal line segment and the second clock signal line segment.

18. The domino logic system of claim 17, wherein the delay circuit controls the relative timing of a first clock signal on the first clock signal line segment and a second clock signal on the second clock signal line segment.

19. A clock-delayed pseudo-NMOS domino logic system, comprising:
   a first stage, having:
      a first logic circuit having a first input node and a first output node;
      a first enabling transistor coupled between the first output node and a first power supply node; and
      a first pre-charge transistor coupled between the first output node and a second power supply node;
   a second stage, having:

a second logic circuit having a second input node and a second output node;

a second enabling transistor coupled between the second output node and first the power supply node; and a second pre-charge transistor coupled between the second output node and the second power supply node;

the first output node being coupled to the second input node;

a clock signal line coupled to the first and second pre-charge transistors and to the first and second enabling transistors, wherein the clock signal line comprises a first clock signal line segment and a second clock signal line segment, the first clock signal line segment being coupled to the first pre-charge transistor and the first enabling transistor and the second clock signal line segment being coupled to the second pre-charge transistor and the second enabling transistor; and a delay circuit coupled between the first clock signal line segment and the second clock signal line segment.

20. The domain logic system of claim 19, wherein the first power supply node comprises a positive power supply node and the second power supply node comprises a power supply electrical ground node.

21. The domino logic system of claim 19, wherein the first power supply node comprises a positive power supply node and the second power supply node comprises a power supply electrical ground node.

22. The domino logic system of claim 19, wherein the first and second pre-charge transistors are n-channel transistors, and wherein the first and second enabling transistors are p-channel transistors.

23. The domino logic system of claim 19, wherein the first power supply node comprises a positive power supply node and the second power supply node comprises a power supply electrical ground node.

24. The domino logic system of claim 19, wherein the first and second pre-charge transistors are p-channel transistors, and wherein the first and second enabling transistors are n-channel transistors.

* * * * *